(12) United States Patent
Machii et al.

(10) Patent No.: US 9,608,143 B2
(45) Date of Patent: Mar. 28, 2017

(54) COMPOSITION FOR FORMING N-TYPE DIFFUSION LAYER, METHOD OF FORMING N-TYPE DIFFUSION LAYER, AND METHOD OF PRODUCING PHOTOVOLTAIC CELL

(71) Applicant: Hitachi Chemical Company, Ltd., Chiyoda-ku, Tokyo (JP)

(72) Inventors: Youichi Machii, Tsukuba (JP); Masato Yoshida, Tsukuba (JP); Takeshi Nojiri, Tsukuba (JP); Kaoru Okaniwa, Tsukuba (JP); Mitsunori Iwamuro, Tsukuba (JP); Shuichiro Adachi, Tsukuba (JP); Tetsuya Sato, Tsukuba (JP); Keiko Kizawa, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/076,225

(22) Filed: Nov. 10, 2013

(65) Prior Publication Data

US 2014/0120648 A1 May 1, 2014

Related U.S. Application Data

(62) Division of application No. 13/642,525, filed as application No. PCT/JP2011/059969 on Apr. 22, 2011, now abandoned.

(30) Foreign Application Priority Data

Apr. 23, 2010 (JP) .................................. 2010-100222

(51) Int. Cl.
H01L 21/00 (2006.01)
H01L 31/0288 (2006.01)
(Continued)

(52) U.S. Cl.
CPC .......... *H01L 31/0288* (2013.01); *C03C 3/097* (2013.01); *C03C 8/18* (2013.01);
(Continued)

(58) Field of Classification Search
CPC .............................. H01L 31/18; H01L 21/22
(Continued)

(56) References Cited

U.S. PATENT DOCUMENTS 2,794,846 A 6/1957 Fuller
4,891,331 A 1/1990 Rapp
(Continued)

FOREIGN PATENT DOCUMENTS

CN 1343376 4/2002
JP 02-162720 A 6/1990
(Continued)

OTHER PUBLICATIONS

Final Office Action issued Dec. 23, 2013, in U.S. Appl. No. 13/642,525.
(Continued)

*Primary Examiner* — Reema Patel
*Assistant Examiner* — Syed Gheyas
(74) *Attorney, Agent, or Firm* — Seyfarth Shaw LLP

(57) ABSTRACT

The composition for forming an n-type diffusion layer in accordance with the present invention contains a glass powder and a dispersion medium, in which the glass powder includes an donor element and a total amount of the life time killer element in the glass powder is 1000 ppm or less. An n-type diffusion layer and a photovoltaic cell having an n-type diffusion layer are prepared by applying the composition for forming an n-type diffusion layer, followed by a thermal diffusion treatment.

12 Claims, 2 Drawing Sheets

(51) Int. Cl.

| | |
|---|---|
| *C03C 8/18* | (2006.01) |
| *H01L 21/22* | (2006.01) |
| *H01L 21/225* | (2006.01) |
| *H01L 31/0224* | (2006.01) |
| *H01L 31/0236* | (2006.01) |
| *H01L 31/068* | (2012.01) |
| *H01L 31/18* | (2006.01) |
| *H01L 21/04* | (2006.01) |
| *C03C 3/097* | (2006.01) |

(52) U.S. Cl.
CPC .............. *H01L 21/04* (2013.01); *H01L 21/22* (2013.01); *H01L 21/2225* (2013.01); *H01L 21/2255* (2013.01); *H01L 31/0236* (2013.01); *H01L 31/022425* (2013.01); *H01L 31/068* (2013.01); *H01L 31/18* (2013.01); *H01L 31/1804* (2013.01); *Y02E 10/547* (2013.01); *Y02P 70/521* (2015.11)

(58) Field of Classification Search
USPC .......................................................... 438/98
See application file for complete search history.

(56) References Cited

U.S. PATENT DOCUMENTS

| | | | |
|---|---|---|---|
| 5,145,510 A | 9/1992 | Saito et al. | |
| 5,899,704 A | 5/1999 | Schlosser et al. | |
| 6,695,903 B1 * | 2/2004 | Kubelbeck et al. | ..... 106/287.14 |
| 2005/0160970 A1 | 7/2005 | Niira et al. | |
| 2009/0301553 A1 | 12/2009 | Konno et al. | |
| 2010/0136314 A1 * | 6/2010 | Umayahara et al. | ......... 428/220 |
| 2010/0154875 A1 * | 6/2010 | Borland et al. | ............... 136/255 |
| 2010/0258165 A1 | 10/2010 | Carroll et al. | |
| 2012/0040490 A1 | 2/2012 | Gallazzo et al. | |

FOREIGN PATENT DOCUMENTS

| | | |
|---|---|---|
| JP | H02177569 | 7/1990 |
| JP | 04-158514 A | 6/1992 |
| JP | 04-174517 A | 6/1992 |
| JP | 2002-075894 A | 3/2002 |
| JP | 2002539615 | 11/2002 |
| JP | 2006-021952 | 1/2006 |
| JP | 2009-117729 A | 5/2009 |
| JP | 2009-177129 A | 8/2009 |
| JP | 2009-200276 A | 9/2009 |
| JP | 2010-074149 A | 4/2010 |
| KR | 10-1992-0005467 B1 | 7/1992 |
| KR | 2001-0112313 | 12/2001 |
| TW | 492081 B | 6/2002 |
| TW | 201007770 A | 2/2010 |
| WO | WO 2008/085806 | 7/2008 |
| WO | WO 2009/060761 A1 | 5/2009 |

OTHER PUBLICATIONS

M. G. Hawes, The Platinum Metals in Glass, 1957, Platinum Metals Rev. 1, (2), 44-48.
U.S. Appl. No. 13/642,526, filed Dec. 5, 2012.
Non-Final Office Action dated Aug. 5, 2013, in U.S. Appl. No. 13/642,526.
Extended European Search Report dated Aug. 13, 2013, in European Patent Application No. 11772109.2.
Extended European Search Report dated Aug. 25, 2014, in European Patent Application No. 11772108.4.
Office Action issued Aug. 27, 2014, in Taiwanese Patent Application No. 10321168050.
Partial Translation of Office Action issued in Chinese Application No. 201180020190.8 on Dec. 23, 2014.
Guillevin, N., et al.: "High Efficiency N-Type Multicrystalline Solar Cells", 19th Workshop on Crystalline Silicon Solar Cells & Modules; Materials and Processes, Aug. 9-12, 2009, Vail, Co., USA.
Office Action issued in Taiwanese Patent Application No. 103123837, mailed , Sep. 21, 2015.
Office Action issued in Japanese Patent Application No. 2014-035732, mailed Sep. 8, 2015.
Office Action issued in Korean Patent Application No. 2012-7028223, mailed, Nov. 17, 2016.

* cited by examiner

COMPOSITION FOR FORMING N-TYPE DIFFUSION LAYER, METHOD OF FORMING N-TYPE DIFFUSION LAYER, AND METHOD OF PRODUCING PHOTOVOLTAIC CELL

TECHNICAL FIELD

The present invention relates to a composition for forming an n-type diffusion layer of a photovoltaic cell, a method of forming an n-type diffusion layer, a method of producing a photovoltaic cell. More specifically, the present invention relates to a technique which enables the formation of an n-type diffusion layer on a certain portion of silicon substrate which is a semiconductor substrate.

BACKGROUND ART

A related art fabrication process of a silicon photovoltaic cell is described hereinbelow.

First, in order to realize high efficiency by promoting optical confinement effects, a p-type silicon substrate having a textured structure formed on a light receiving side is prepared, and subsequently subjected to a treatment at a temperature of 800 to 900° C. for several tens of minutes under a mixed gas atmosphere of phosphorus oxychloride ($POCl_3$), nitrogen and oxygen, thereby uniformly forming an n-type diffusion layer on the substrate. According to this method of the related art, since diffusion of phosphorus is carried out using a mixed gas, the n-type diffusion layer is formed not only on the front surface, but also on the side surface and the rear surface. For these reasons, there has been a need for a side etching process to remove the n-type diffusion layer on the side surface. Further, the n-type diffusion layer of the rear surface needs to be converted into a p+-type diffusion layer, correspondingly an aluminum paste is assigned to the n-type diffusion layer of the rear surface to achieve conversion of the n-type diffusion layer into the $p^+$-type diffusion layer through the diffusion of aluminum.

Meanwhile, in the manufacturing field of semiconductors, there has been proposed a method of forming an n-type diffusion layer by applying a solution containing phosphates such as phosphorus pentoxide ($P_2O_5$) or ammonium dihydrogen phosphate ($NH_4H_2PO_4$) (for example, see Japanese Patent Application Laid-Open (JP-A) No. 2002-75894). However, in such a method, since a solution is used, similarly to the above-stated gas-phase reaction method using a mixed gas, diffusion of phosphorus occurs at the side surface and rear surface during the formation of a diffusion layer, and an n-type diffusion layer is formed not only on the surface, but also on the side surface and the rear surface.

SUMMARY OF INVENTION

Technical Problem

As described above, in a gas-phase reaction using phosphorus oxychloride in the formation of an n-type diffusion layer, an n-type diffusion layer is formed not only on one side that requires the essential n-type diffusion layer (ordinary light-receiving side, front surface), but also on the other face (non-light receiving side, rear surface) and the side surface. Further, even in a method involving applying a phosphorus-containing solution followed by thermal diffusion, an n-type diffusion layer is also formed on portions even in addition to the front surface, similarly to the gas-phase reaction method. Accordingly, in order to secure a p-n junction structure as an element, a side surface should be etched, and a rear surface should be subjected to the conversion of the n-type diffusion layer into the p-type diffusion layer. Generally, the conversion of the n-type diffusion layer into the p-type diffusion layer is achieved by applying, on the rear surface, a paste of aluminum which is an element of Group XIII of the periodic table, followed by sintering.

The present invention has been made in view of the above problems exhibited by the background art, and it is an object of the present invention to provide: a composition for forming an n-type diffusion layer in a manufacturing process of a photovoltaic cell using a crystalline silicon substrate, which is capable of forming an n-type diffusion layer on a certain portion of the substrate without the formation of an n-type diffusion layer on an unnecessary region, and which does not significantly shorten a life time of a carrier in the substrate including the n-type diffusion layer; a method of forming an n-type diffusion layer; and a method of producing a photovoltaic cell.

Solution to Problem

The above-stated problems are addressed by the following means.

<1> A composition for forming an n-type diffusion layer, the composition containing a glass powder and a dispersion medium, wherein the glass powder includes a donor element and a total amount of the life time killer element in the glass powder is 1000 ppm or less.

<2> The composition for forming an n-type diffusion layer according to <1>, in which the donor element is at least one selected from phosphorous (P) or antimony (Sb).

<3> The composition for forming an n-type diffusion layer according to <1> or <2>, in which the glass powder contains at least one donor element-containing material selected from $P_2O_3$, $P_2O_5$ or $Sb_2O_3$, and at least one glass component material selected from $SiO_2$, $K_2O$, $Na_2O$, $Li_2O$, BaO, SrO, CaO, MgO, BeO, ZnO, PbO, CdO, SnO, $ZrO_2$ or $MoO_3$.

<4> The composition for forming an n-type diffusion layer according to any one of <1> to <3>, further containing a metal element that is crystallized upon reacting with the glass powder.

<5> The composition for forming an n-type diffusion layer according to <4>, in which the metal element that is crystallized upon reacting with the glass powder is at least one selected from silver (Ag), silicon (Si) or zinc (Zn).

<6> The composition for forming an n-type diffusion layer according to any one of <1> to <5>, in which the life time killer element is at least one selected from iron (Fe), copper (Cu), nickel (Ni), manganese (Mn), chromium (Cr), tungsten (W) or gold (Au).

<7> A method of forming an n-type diffusion layer, the method including:

applying the composition for forming an n-type diffusion layer of any one of <1> to <6>; and conducting a thermal diffusion treatment.

<8> A method of producing a photovoltaic cell, the method including:

applying, on a semiconductor substrate, the composition for forming an n-type diffusion layer of any one of <1> to <6>;

conducting the substrate to a thermal diffusion treatment to form an n-type diffusion layer; and forming an electrode on the n-type diffusion layer.

Advantageous Effects of Invention

The present invention enables, in the manufacturing process of a photovoltaic cell using a silicon substrate, the formation of an n-type diffusion layer on a certain portion of the substrate without the formation of an n-type diffusion layer on an unnecessary region, and does not significantly shorten a life time of a carrier in the substrate having the n-type diffusion layer.

DESCRIPTION OF EMBODIMENTS

Figure 1:
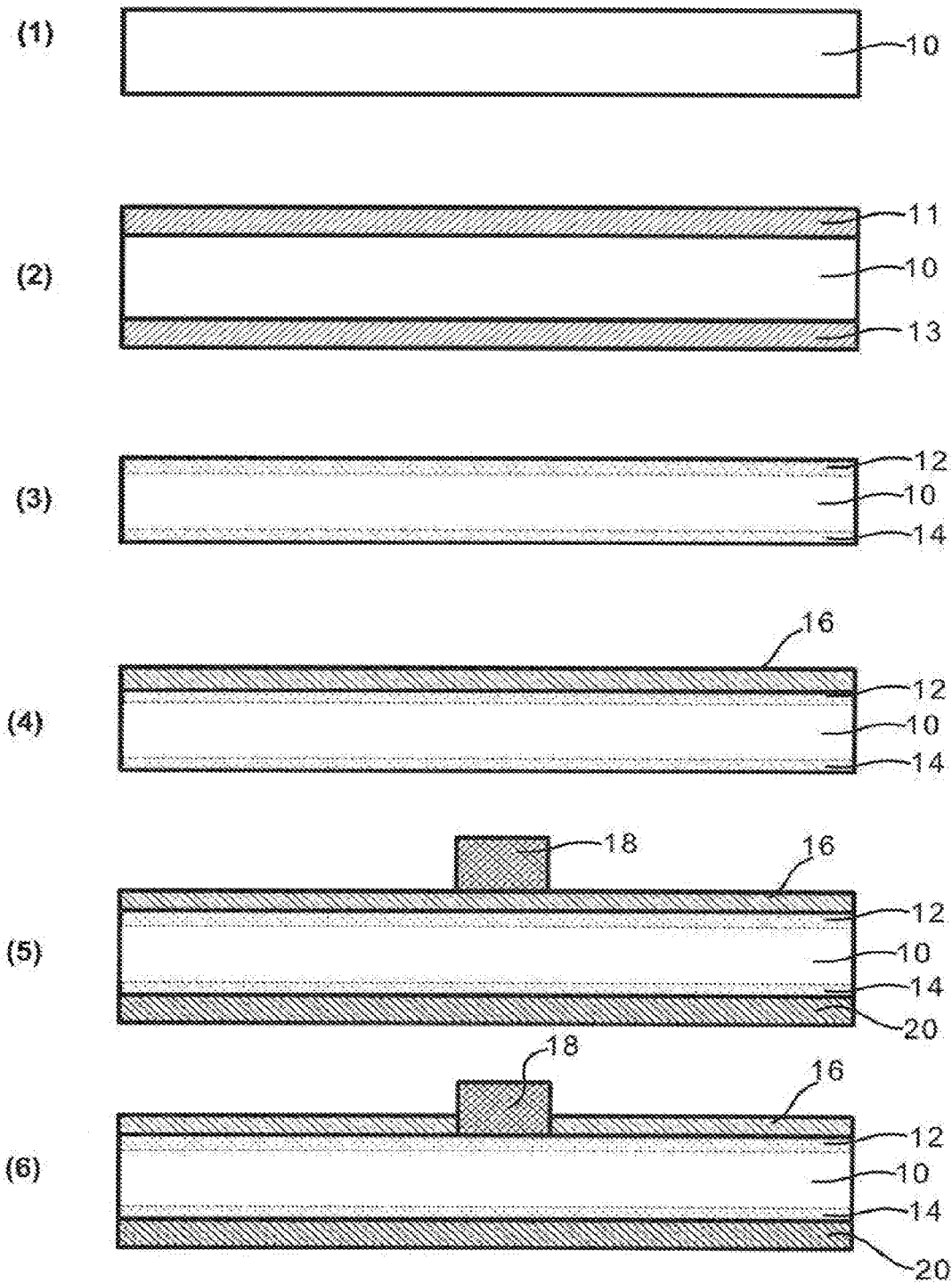
FIG. 1 is a cross-sectional view conceptually showing an example of the manufacturing process of a photovoltaic cell in the present invention.

First, a composition for forming an n-type diffusion layer in accordance with the present invention will be described, and then a method of forming an n-type diffusion layer and a method of producing a photovoltaic cell, using the composition for forming an n-type diffusion layer, will be described.

In the present specification, the term "process" denotes not only independent processes but also processes that cannot be clearly distinguished from other processes as long as a purpose is accomplished by the process.

In the present specification, "from . . . to . . . " denotes a range including each of the minimum value and the maximum value of the values described before and after the reference.

Further, in the case in which the plurality of the materials corresponding to each component are present in the composition, the amount of each component in the composition means a total amount of plural materials present in the composition unless otherwise specified.

The composition for forming an n-type diffusion layer, containing a glass powder and a dispersion medium, in which the glass powder includes an donor element and a total amount of the life time killer element in the glass powder is 1000 ppm or less (hereinafter, often referred to simply as "glass powder"), and may further contain other additives as necessary, taking into consideration coatability or the like.

As used herein, the term "composition for forming an n-type diffusion layer" refers to a material which contains a donor element and is capable of forming an n-type diffusion layer by diffusion of the donor element, for example, through thermal diffusion treatment (sintering) of the donor element after application of the material to a silicon substrate. The use of the composition for forming an n-type diffusion layer according to the present invention ensures that an n-type diffusion layer is formed in a desired portion where the composition for forming an n-type diffusion layer is applied, and an unnecessary n-type diffusion layer is not formed on a rear surface or side surface where the composition for forming an n-type diffusion layer is not applied.

Accordingly, when the composition for forming an n-type diffusion layer according to the present invention is applied, a side etching process essential in the conventionally widely used gas-phase reaction method becomes unnecessary; consequently the process is simplified. In addition, a process for converting an n-type diffusion layer formed on the rear surface into a $p^+$-type diffusion layer becomes unnecessary. For these reasons, a method of forming a $p^+$-type diffusion layer on the rear surface, the constituent material of a rear surface electrode, and shape and thickness of a rear surface electrode are not limited, and the option range of applicable producing methods, constituent materials and shapes is widened. Although details will be described hereinafter, the occurrence of internal stress in a silicon substrate due to the thickness of the rear surface electrode is suppressed; consequently warpage of the silicon substrate is also suppressed.

In addition, in the composition for forming an n-type diffusion layer according to the present invention, since a total amount of the life time killer element in the glass powder of the composition is 1000 ppm or less, a life time of a carrier in the substrate having the n-type diffusion layer does not significantly shorten. Details of the life time killer element are described later.

Further, a glass powder contained in the composition for forming an n-type diffusion layer in accordance with the present invention is melted by means of sintering to form a glass layer over an n-type diffusion layer. However, a conventional gas-phase reaction method or a conventional method of applying a phosphate-containing solution also forms a glass layer over an n-type diffusion layer, and therefore the glass layer formed in the present invention can be removed by etching, similarly to the conventional method. Accordingly, even when compared with the conventional method, the composition for forming an n-type diffusion layer in accordance with the present invention generates no unnecessary products and no further additional processes.

Further, since a donor component in the glass powder is hardly volatilized even during sintering, an n-type diffusion layer is prevented from also being formed on the rear surface or side surface rather than on the front surface alone due to the generation of volatile gases. It is assumed that the reason for this is that the donor component combines with an element in a glass powder, or is absorbed into the glass, as a result of which the donor component is hardly volatilized.

As described above, since the composition for forming an n-type diffusion layer in accordance with the present invention can form an n-type diffusion layer in a desired portion at a desired concentration, it is possible to form a selective region with a high n-type dopant concentration. Meanwhile, it is difficult to form a selective region having a high n-type dopant concentration by a conventional method such as a method using a gas-phase reaction or a method using a solution containing phosphates.

The donor element-containing glass powder in accordance with the present invention will be described in more detail.

As used herein, the term "donor element" refers to an element which is capable of forming an n-type diffusion layer by doping thereof on a silicon substrate. As the donor element, elements of Group XV of the periodic table can be used. Examples of the donor element include P (phosphorous), Sb (antimony), Bi (bismuth) and As (arsenic). From the viewpoint of safety, convenience of vitrification or the like, P or Sb is preferable.

Examples of the donor element-containing material which is used for introducing the donor element into the glass powder include $P_2O_3$, $P_2O_5$, $Sb_2O_3$, $Bi_2O_3$, and $As_2O_3$. At least one selected from $P_2O_3$, $P_2O_5$ or $Sb_2O_3$ is preferably used.

Further, the melting temperature, softening point, glass-transition point, chemical durability or the like of the glass powder may be controlled by adjusting the component ratio, if necessary. Further, the glass powder preferably contains the glass component material mentioned below.

Examples of the glass component material include $SiO_2$, $K_2O$, $Na_2O$, $Li_2O$, BaO, SrO, CaO, MgO, BeO, ZnO, PbO, CdO, $V_2O_5$, SnO, $ZrO_2$, $MoO_3$, $La_2O_3$, $Nb_2O_5$, $Ta_2O_5$, $Y_2O_3$, $TiO_2$, $ZrO_2$, $GeO_2$, $TeO_2$ and $Lu_2O_3$. At least one selected from $SiO_2$, $K_2O$, $Na_2O$, $Li_2O$, BaO, SrO, CaO, MgO, BeO, ZnO, PbO, CdO, SnO, $ZrO_2$ or $MoO_3$ is preferably used.

Specific examples of the donor element-containing glass powder include materials including both the donor element-containing material and the glass component material, for example, $P_2O_5$ based glass which includes $P_2O_5$ as the donor element such as $P_2O_5$—$SiO_2$ (the donor element-containing material and the glass component material are listed in this order, and are listed in the same order below)-based glass, $P_2O_5$—$K_2O$-based glass, $P_2O_5$—$Na_2O$-based glass, $P_2O_5$—$Li_2O$-based glass, $P_2O_5$—BaO-based glass, $P_2O_5$—SrO-based glass, $P_2O_5$—CaO-based glass, $P_2O_5$—MgO-based glass, $P_2O_5$—BeO-based glass, $P_2O_5$—ZnO-based glass, $P_2O_5$—CdO-based glass, $P_2O_5$—PbO-based glass, $P_2O_5$—$CeO_2$-based glass, $P_2O_5$—SnO-based glass, $P_2O_5$—$GeO_2$-based glass, or $P_2O_5$—$TeO_2$-based glass; $Sb_2O_3$ based glass in which $P_2O_5$ is replaced by $Sb_2O_3$ as a donor element-containing material in the $P_2O_5$ based glass.

The donor element-containing glass powder may include two or more donor element-containing materials such as $P_2O_5$—$Sb_2O_3$, $P_2O_5$—$As_2O_3$ or the like.

Although composite glass containing two components was illustrated in the above, composite glass containing three or more components, such as $P_2O_5$—$SiO_2$—$CeO_2$ or $P_2O_5$—$SiO_2$—CaO, may also be possible.

The total amount of an element which makes a life time of a carrier shortened (life time killer element) is 1000 ppm or less, preferably 500 ppm or less, more preferably 100 ppm or less, and still more preferably 10 ppm or less.

The life time killer element includes Fe, Cu, Ni, Mn, Cr, W, Au or the like. The amount of the element may be analyzed by ICP mass spectrometer, ICP optical emission spectrometer or atomic absorption spectrometer. A life time of a carrier may be measured by microwave reflectance photoconductivity decay (μ-PCD) method.

The content of the glass component material in the glass powder is preferably appropriately set taking into consideration the melting temperature, the softening point, the glass-transition point, and chemical durability. Generally, the content of the glass component material is preferably from 0.1% by mass to 95% by mass, and more preferably from 0.5% by mass to 90% by mass.

The softening point of the glass powder is preferably in the range of from 200° C. to 1000° C., and more preferably from 300° C. to 900° C., from the viewpoint of diffusivity during the diffusion treatment, and dripping. The softening point of the glass powder may be measured by a known differential thermal analysis (DTA) and using an endothermic peak thereof.

The shape of the glass powder includes a substantially spherical shape, a flat shape, a block shape, a plate shape, a scale-like shape, or the like. From the viewpoint of the coating property to a substrate and uniform dispersion property upon forming a composition for forming an n-type diffusion layer, it is preferably a spherical shape, a flat shape, or a plate shape.

The particle diameter of the glass powder is preferably 100 μm or less. When a glass powder having a particle diameter of 100 μm or less is used, a smooth coated film may be easily obtained. Further, the particle diameter of the glass powder is more preferably 50 μm or less. The lower limit of the particle diameter is not particularly limited, and preferably 0.01 μm or more.

The particle diameter of the glass powder means the average particle diameter, and may be measured by laser diffraction particle size analyzer or the like.

The donor element-containing glass powder is prepared according to the following procedure.

First, raw materials are weighed and placed in a crucible. Examples of the material for the crucible include platinum, platinum-rhodium, iridium, alumina, quartz and carbon, which are appropriately selected taking into consideration the melting temperature, atmosphere, reactivity with melted materials, and the like.

Next, the raw materials are heated to a temperature corresponding to the glass composition in an electric furnace, thereby preparing a melted liquid. At this time, stirring is preferably applied such that the melted liquid becomes homogenous.

Subsequently, the obtained melted liquid is allowed to flow on a zirconia substrate, a carbon substrate or the like to result in vitrification of the melted liquid.

Finally, the glass is pulverized into a powder. The pulverization may be carried out by using a known method such as using a jet mill, bead mill ball mill or the like.

The content of the donor element-containing glass powder in the composition for forming an n-type diffusion layer is determined taking into consideration coatability, diffusivity of donor elements or the like. Generally, the content of the glass powder in the composition for forming an n-type diffusion layer is preferably from 0.1% by mass to 95% by mass, and more preferably from 1% by mass to 90% by mass.

Hereinafter, a dispersion medium will be described.

The dispersion medium is a medium which disperses the glass powder in the composition. Specifically, a binder, a solvent or the like is employed as the dispersion medium.

For example, the binder may be appropriately selected from a dimethylaminoethyl (meth)acrylate polymer, a polyvinyl alcohol, polyacrylamides, polyvinyl amides, polyvinyl pyrrolidone, poly(meth)acrylic acids, polyethylene oxides, polysulfonic acids, acrylamide alkyl sulfonic acids, cellulose ethers, cellulose derivatives, carboxymethylcellulose, hydroxyethylcellulose, ethylcellulose, gelatin, starch and starch derivatives, sodium alginates, xanthane, guar and guar derivatives, scleroglucan and scleroglucan derivatives, tragacanth and tragacanth derivatives, dextrin and dextrin derivatives, acrylic acid resins, acrylic acid ester resins, butadiene resins, styrene resins, copolymers thereof, silicon dioxide, and the like. These compounds may be used individually or in a combination of two or more thereof.

The molecular weight of the binder is not particularly limited and is preferably appropriately adjusted taking into consideration the desired viscosity of the composition.

Examples of the solvent include ketone solvents such as acetone, methylethylketone, methyl-n-propylketone, methyl-iso-propylketone, methyl-n-butylketone, methyl-iso-butylketone, methyl-n-pentylketone, methyl-n-hexylketone, diethylketone, dipropylketone, di-iso-butylketone, trimethylnonanone, cyclohexanone, cyclopentanone, methylcyclohexanone, 2,4-pentanedione and acetonylacetone; ether solvents such as diethyl ether, methyl ethyl ether, methyl-n-propyl ether, di-iso-propyl ether, tetrahydrofuran, methyl tetrahydrofuran, dioxane, dimethyl dioxane, ethylene glycol dimethyl ether, ethylene glycol diethyl ether, ethylene glycol di-n-propyl ether, ethylene glycol dibutyl ether, diethylene glycol dimethyl ether, diethylene glycol diethyl ether, diethylene glycol methyl ethyl ether, diethylene glycol methyl n-propyl ether, diethylene glycol methyl n-butyl ether, diethylene glycol di-n-propyl ether, diethylene glycol di-n-butyl ether, diethylene glycol methyl n-hexyl ether, triethylene glycol dimethyl ether, triethylene glycol diethyl ether, triethylene glycol methyl ethyl ether, triethylene glycol methyl n-butyl ether, triethylene glycol di-n-butyl ether, triethylene glycol methyl n-hexyl ether, tetraethylene glycol dimethyl ether, tetraethylene glycol diethyl ether, tetradiethylene glycol methyl ethyl ether, tetraethylene glycol methyl n-butyl ether, diethylene glycol di-n-butyl ether, tetraethylene glycol methyl n-hexyl ether, tetraethylene glycol di-n-butyl ether, propylene glycol dimethyl ether, propylene glycol diethyl ether, propylene glycol di-n-propyl ether, propylene glycol dibutyl ether, dipropylene glycol dimethyl ether, dipropylene glycol diethyl ether, dipropylene glycol methyl ethyl ether, dipropylene glycol methyl n-butyl ether, dipropylene glycol di-n-propyl ether, dipropylene glycol di-n-butyl ether, dipropylene glycol methyl n-hexyl ether, tripropylene glycol dimethyl ether, tripropylene glycol diethyl ether, tripropylene glycol methyl ethyl ether, tripropylene glycol methyl n-butyl ether, tripropylene glycol di-n-butyl ether, tripropylene glycol methyl n-hexyl ether, tetrapropylene glycol dimethyl ether, tetrapropylene glycol diethyl ether, tetradipropylene glycol methyl ethyl ether, tetrapropylene glycol methyl n-butyl ether, dipropylene glycol di-n-butyl ether, tetrapropylene glycol methyl n-hexyl ether, and tetrapropylene glycol di-n-butyl ether; ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methyl pentyl acetate, 2-ethyl butyl acetate, 2-ethyl hexyl acetate, 2-(2-butoxyethoxy) ethyl acetate, benzyl acetate, cyclohexyl acetate, methyl cyclohexyl acetate, nonyl acetate, methyl acetoacetate, ethyl acetoacetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, glycol diacetate, methoxy tri glycol acetate, ethyl propionate, n-butyl propionate, i-amyl propionate, diethyl oxalate, di-n-butyl oxalate, methyl lactate, ethyl lactate, n-butyl lactate, n-amyl lactate, ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol-n-butyl ether acetate, propylene glycol methyl ether acetate, propylene glycol ethyl ether acetate, propylene glycol propyl ether acetate, dipropylene glycol methyl ether acetate, dipropylene glycol ethyl ether acetate, γ-butyrolactone, and γ-valerolactone; aprotic polar solvents such as acetonitrile, N-methylpyrrolidinone, N-ethyl pyrrolidinone, N-propyl pyrrolidinone, N-butyl pyrrolidinone, N-hexyl pyrrolidinone, N-cyclohexyl pyrrolidinone, N,N-dimethyl formamide, N,N-dimethyl acetamide, and dimethyl sulfoxide; alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxy butanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, and tripropylene glycol; glycol monoether solvents such as ethylene glycol methyl ether, ethylene glycol ethyl ether, ethylene glycol monophenyl ether, diethylene glycol monomethyl ether, diethylene glycol monoethyl ether, diethylene glycol mono-n-butyl ether, diethylene glycol mono-n-hexyl ether, ethoxy triglycol, tetraethylene glycol mono-n-butyl ether, propylene glycol monomethyl ether, dipropylene glycol monomethyl ether, dipropylene glycol monoethyl ether, and tripropylene glycol monomethyl ether; terpene solvents such as α-terpinene, α-terpinenol, myrcene, allo-ocimene, limonene, dipentene, α-pinene, β-pinene, terpinenol, carvone, ocimene and phellandrene; water, and the like. These materials may be used individually or in a combination of two or more thereof.

From the viewpoint of the coating property of the composition for forming an n-type diffusion layer at a substrate, α-terpinenol, diethylene glycol mono-n-butyl ether or 2-(2-butoxyethoxy) ethyl acetate is preferable.

The content of the dispersion medium in the composition for forming an n-type diffusion layer is determined taking into consideration coatability and donor concentration.

The viscosity of the composition for forming an n-type diffusion layer is preferably from 10 mPa·S to 1,000,000 mPa·S, and more preferably from 50 mPa·S to 500,000 mPa·S, taking into consideration coatability.

Further, the composition for forming an n-type diffusion layer may contain other additives. Examples of the other additives include metals which are readily reactive with the glass powder.

The composition for forming an n-type diffusion layer is applied on a semiconductor substrate and heat-treated at a high temperature to form an n-type diffusion layer, during which glass is formed on the surface of the substrate. This glass is removed by dipping in acid such as hydrofluoric acid, but may be difficult to remove depending on the type of glass. In such a case, by adding a metal such as Ag, Zn or Si, which easily undergo crystallization with glass, the glass may be easily removed after acid washing. Among these metals, it is preferable that at least one selected from Ag, Si or Zn is used.

It is preferable that the content of the metal(s) which is/are readily reactive with the glass powder is appropriately adjusted depending on the type of glass or the type of the metal concerned. Generally, the content of the metal is preferably from 0.01% by mass to 10% by mass, relative to the glass powder.

In the case in which the total amount of the life time killer element in the glass powder is 1000 ppm or less, the total amount of the life time killer element in the composition for forming an n-type diffusion layer is approximately 1100 ppm or less. Therefore, the total amount of the life time killer element in the composition for forming an n-type diffusion layer is preferably 500 ppm or less, and more preferably 100 ppm or less.

Hereinafter, the method of forming an n-type diffusion layer and the method of producing a photovoltaic cell according to the present invention are described with reference to FIG. 1. FIG. 1 is a schematic cross-sectional view conceptionally showing an example of the production process of a photovoltaic cell according to the present invention. In the drawings, like numbers refer to like elements throughout the specification.

In FIG. 1(1), an alkaline solution is assigned to silicon substrate which is a p-type semiconductor substrate 10, thereby removing the damaged layer, and a textured structure is obtained by etching.

Specifically, the damaged layer of the silicon surface, which is caused when being sliced from an ingot, is removed by using 20% by mass of caustic soda. Then, a textured structure is formed by etching with a mixture of 1% by mass of caustic soda and 10% by mass of isopropyl alcohol (in the drawing, the textured structure is omitted). The photovoltaic cell achieves high efficiency through the formation of a textured structure on the light-receiving side (front surface) to promote optical confinement effects.

In FIG. 1(2), the composition for forming an n-typo diffusion layer is applied on a front surface of the p-type semiconductor substrate 10, that is, a face serving as a light-receiving side, thereby forming an n-type diffusion layer-forming composition layer 11. In the present invention, there is no limit to the application method, for example, a printing method, a spinning method, brush application, a spray method, a doctor blade method, a roll coater method, an inkjet method or the like can be used.

The amount of coating of the composition for forming an n-type diffusion layer is not particularly limited. It is in the range of from 0.01 g/m$^2$ to 100 g/m$^2$ in terms of an amount of glass powder, and preferably from 0.1 g/m$^2$ to 10 g/m$^2$.

Further, depending on the composition of the composition for forming an n-type diffusion layer, a drying process for volatilization of the solvent contained in the composition may be required after the application thereof, if necessary. In this case, the drying is carried out at a temperature of 80° C. to 300° C., for 1 minute to 10 minutes when using a hot plate, or for 10 minutes to 30 minutes when using a dryer or the like. Since these drying conditions are dependent on the solvent composition of the composition for forming an n-type diffusion layer, the present invention is not particularly limited to the above-stated conditions.

When using the producing method of the present invention, a producing method of a p-type diffusion layer (high-density electric field layer) 14 of the rear surface may employ any conventional known method without being limited to the method involving conversion of an n-type diffusion layer into a p-type diffusion layer using aluminum, and the range of choices for the producing method is then widened. Accordingly, for example, by assigning the composition 13 containing an element of Group XIII of the periodic table, such as boron (B), the high-density electric field layer 14 may be formed.

As the composition 13 containing an element of Group XIII of the periodic table, such as boron (B), a composition for forming a p-type diffusion layer is included. The composition for forming a p-type diffusion layer is composed in the same manner as the composition for forming an n-type diffusion layer, except that an acceptor element-containing glass powder is used instead of a donor element-containing glass powder. An acceptor element may be an element of Group XIII of the periodic table, for example, boron (B), aluminum (Al) or gallium (Ga) or the like. The acceptor element-containing glass powder preferably includes at least one selected from $B_2O_3$, $Al_2O_3$ and $Ga_2O_3$.

The method for applying the composition for forming a p-type diffusion layer to a rear side of a silicon substrate is the same as the method mentioned above for applying the composition for forming an n-type diffusion layer to a silicon substrate.

The composition for forming a p-type diffusion applied to the rear side is subjected to thermal diffusion treatment in the same manner as when the composition for forming an n-type diffusion layer is used, thereby forming the high-density electric field layer 14 on the rear side. The thermal diffusion treatment of the composition for forming a p-type diffusion layer is preferably simultaneously conducted with the thermal diffusion treatment of the composition for forming an n-type diffusion layer.

Next, the semiconductor substrate 10, on which the n-type diffusion layer-forming composition layer 11 was formed, is subjected to a thermal diffusion treatment at a temperature of 600° C. to 1200° C. This thermal diffusion treatment results in diffusion of a donor element into the semiconductor substrate, thereby forming an n-type diffusion layer 12, as shown in FIG. 1(3). The thermal diffusion treatment may be carried out using a known continuous furnace, batch furnace, or the like. When performing the thermal diffusion treatment, the furnace atmosphere may be appropriately adjusted with air, oxygen, nitrogen, or the like.

The treatment time of the thermal diffusion may be appropriately selected depending on the content of a donor element contained in the composition for forming an n-type diffusion layer. For example, the treatment time of the thermal diffusion may be in the range of from 1 minute to 60 minutes, and preferably from 5 minutes to 30 minutes.

Since a glass layer (not shown) made of phosphoric acid glass or the like is formed on the surface of the formed n-type diffusion layer 12, the glass layer is removed by etching. The etching may be carried out by using a known method, including a method of dipping a subject in an acid such as hydrofluoric acid, a method of dipping a subject in an alkali such as caustic soda, or the like.

As shown in FIGS. 1(2) and 1(3), the n-type diffusion layer-forming method of forming an n-type diffusion layer 12 according to the present invention using the composition for forming an n-type diffusion layer 11 according to the present invention provides the formation of an n-type diffusion layer 12 in the desired site, without the formation of an unnecessary n-type diffusion layer on the rear surface or side surface.

Accordingly, a side etching process for the removal of an unnecessary n-type diffusion layer formed on the side surface has been essential in a method of forming an n-type diffusion layer by the conventionally widely used gas-phase reaction method, but according to the producing method of the present invention, the side etching process becomes unnecessary, and consequently the process is simplified.

Further, the conventional producing method requires the conversion of an unnecessary n-type diffusion layer formed on the rear surface into a p-type diffusion layer, and this conversion method employs a method involving applying a paste of aluminum, which is an element of Group XIII of the periodic table, on the n-type diffusion layer of the rear surface, followed by sintering to diffuse aluminum into the n-type diffusion layer which is thereby converted into a p-type diffusion layer. Since an amount of aluminum greater than a certain level is required to achieve sufficient conversion into a p-type diffusion layer and to form the high-density electric field layer of the p$^+$-type diffusion layer in this method, it has been necessary to form a thick aluminum layer. However, since the coefficient of the thermal expansion of aluminum is considerably different from the coefficient of the thermal expansion of the silicon which is used as a substrate, such a difference results in generation of heavy internal stress in the silicon substrate during the sintering and cooling processes, which contributes to warpage of the silicon substrate.

Such internal stress damages the grain boundary of crystals, resulting in the problem of an increase in power loss. Further, warpage readily leads to damage of cells in the conveyance of photovoltaic cells or in the connection with a copper line referred to as a tab line, during a module process. In recent years, advancement in slice processing techniques has led to thickness reduction of a silicon substrate, which results in a tendency for the cell to be more readily cracked.

On the other hand, since, according to the producing method of the present invention, no unnecessary n-type diffusion layer is formed on the rear surface, there is no need for the conversion of an n-type diffusion layer into a p-type diffusion layer, which consequently abolishes the necessity of making the aluminum layer thicker. As a result, it is possible to suppress the generation of internal stress in the silicon substrate or warpage. Accordingly, an increase in power loss, or damage to cells can be suppressed.

Further, when using the producing method of the present invention, the producing method of a $p^+$-type diffusion layer (high-density electric field layer) 14 of the rear surface may employ any method without being limited to the method involving conversion of an n-type diffusion layer into a p-type diffusion layer using aluminum, and choices for the producing method are then broadened.

For example, it is preferable that the composition for forming a p-type diffusion layer is composed in the same manner as the composition for forming an n-type diffusion layer, except that the glass powder contains an acceptor element instead of the donor element; the composition for forming a p-type diffusion layer is applied to a rear side of a silicon substrate (i.e., the opposite surface to the surface to which the composition for forming an n-type diffusion layer is applied); and thermal diffusion treatment is carried out; thereby forming the high-density electric field layer 14 on the rear side.

As will be described later, the material used for a surface electrode 20 of the rear surface is not limited to aluminum of Group XIII of the periodic table. For example, Ag (silver), Cu (copper) or the like may also be used, so the thickness of the surface electrode 20 of the rear surface may be further reduced as compared to the related art.

In FIG. 1(4), an antireflective film 16 is formed over the n-type diffusion layer 12. The antireflective film 16 is formed by using a known technique. For example, when the antireflective film 16 is a silicon nitride film, the antireflective film 16 is formed by a plasma CVD method using a mixed gas of $SiH_4$ and $NH_3$ as a raw material. At this time, hydrogen diffuses into crystals, and an orbit which does not contribute to bonding of silicon atoms, that is, a dangling bond, binds to hydrogen, which inactivates a defect (hydrogen passivation).

More specifically, the antireflective film 16 is formed under the conditions of a mixed gas $NH_3/SiH_4$ flow ratio of 0.05 to 1.0, a reaction chamber pressure of 0.1 Torr to 2 Torr, a film-forming temperature of 300° C. to 550° C., and a plasma discharge frequency of 100 kHz or higher.

In FIG. 1(5), a metal paste for a surface electrode is printed and applied on the antireflective film 16 of the front surface (light-receiving side) by a screen printing method, followed by drying to form a surface electrode 18. The metal paste for a surface electrode contains (1) metal particles and (2) glass particles as essential components, and optionally (3) a resin binder, (4) other additives.

Then, a rear surface electrode 20 is also formed on the high-density electric field layer 14 of the rear surface. As described hereinbefore, the constituent material and forming method of the rear surface electrode 20 are not particularly limited in the present invention. For example, the rear surface electrode 20 may also be formed by applying the rear surface electrode paste containing a metal such as aluminum, silver or copper, followed by drying. In this case, a portion of the rear surface may also be provided with a silver paste for forming a silver electrode, for connection between cells in the module process.

In FIG. 1(6), electrodes are sintered to complete a photovoltaic cell. When the sintering is carried out at a temperature in the range of 600° C. to 900° C. for several seconds to several minutes, the front surface side undergoes melting of the antireflective film 16 which is an insulating film, due to the glass particles contained in the electrode-forming metal paste, and the silicon 10 surface is also partially melted, by which metal particles (for example, silver particles) in the paste form a contact with the silicon substrate 10, followed by solidification. In this manner, electrical conduction is made between the formed surface electrode 18 and the silicon substrate 10. This process is called fire-through.

Figure 2A:
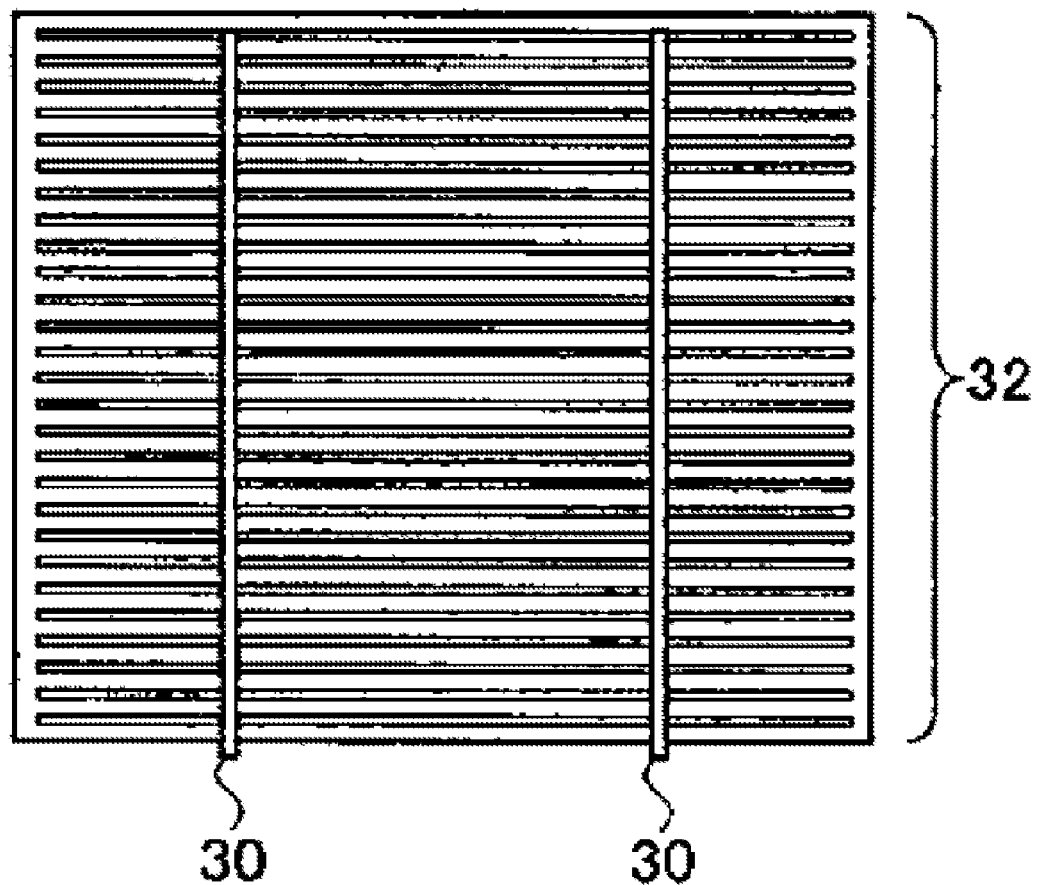
FIG. 2A is a plane view of a photovoltaic cell as seen from the front surface.
Figure 2B:
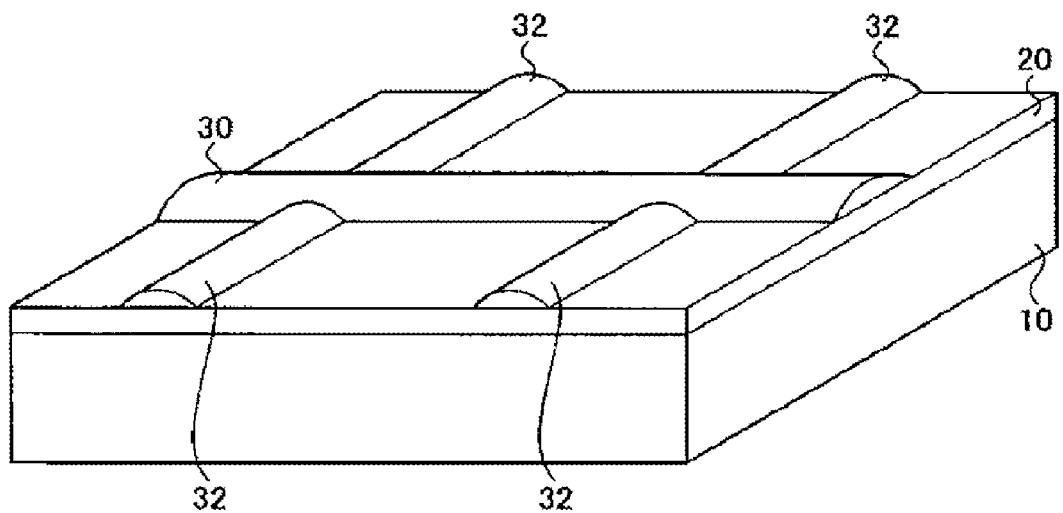
FIG. 2B is a partially enlarged perspective view of FIG. 2A.

Hereinafter, the shape of the surface electrode 18 is described. The surface electrode 18 is made up of a bus bar electrode 30 and a finger electrode 32 intersecting the bus bar electrode 30. FIG. 2A is a plan view of, as seen from the front surface, a photovoltaic cell with a configuration where the surface electrode 18 is made up of the bus bar electrode 30 and the finger electrode 32 intersecting the bus bar electrode 30, and FIG. 2B is a partially enlarged perspective view of FIG. 2A.

The surface electrode 18 may be formed, for example, by the above-stated screen printing of the metal paste, or plating of electrode materials, deposition of electrode materials by electron beam heating under high vacuum, or the like. It is well known that the surface electrode 18 made up of the bus bar electrode 30 and the finger electrode 32 is typically used as an electrode for the light-receiving surface side, and a known method for the formation of the bus bar electrode and the finger electrode of the light-receiving surface side may be applied.

Although a photovoltaic cell having an n-type diffusion layer formed on the front surface, a $p^+$-type diffusion layer formed on the rear surface, and a front surface electrode and a rear surface electrode disposed on the respective layers was described above, the use of the composition for forming an n-type diffusion layer according to the present invention enables the production of a back-contact photovoltaic cell.

The back-contact photovoltaic cell is intended to enlarge a light-receiving surface by providing all of the electrodes on the rear surface. That is, the back-contact photovoltaic cell is required to have a p-n junction structure by forming both an n-type diffusion region and a $p^+$-type diffusion region on the rear surface. The composition for forming an n-type diffusion layer according to the present invention enables the formation of an n-type diffusion portion on a certain region, and therefore may be preferably applied to the production of a back-contact photovoltaic cell.

The disclosures of Japanese Patent Application No. 2010-100222 is incorporated by reference herein in their entireties.

All the literature, patent applications, and technical standards cited herein are also herein incorporated to the same extent as provided for specifically and severally with respect to an individual literature, patent application, and technical standard to the effect that the same should be so incorporated by reference.

EXAMPLES

Hereinafter, Examples in accordance with the present invention will be described in more detail, but the present invention is not limited thereto. Unless specifically indicated, the chemicals used were all of reagent-grade. Unless specifically indicated, "%" refers to "% by mass".

The term "a life time of a carrier" denotes a relative value of a life time of a carrier in a p-type silicon substrate having an n-type diffusion layer formed in each of the Examples or Comparative Examples, relative to a life time of a carrier in a p-type silicon substrate having an n-type diffusion layer formed by a conventional gas-phase diffusion. A life time of a carrier of 70% or more is deemed acceptable from a practical perspective.

Example 1

10 g of $SiO_2$—$P_2O_5$—CaO-based glass powder whose particle shape is substantially spherical, average particle diameter is 3.5 μm ($SiO_2$: 60 mol %, $P_2O_5$: 30 mol %, CaO: 10 mol %, life time killer element: 970 ppm), 4 g of ethylcellulose and 86 g of 2-(2-butoxyethoxy) ethyl acetate were mixed with an automatic mortar kneading machine and made into a paste to prepare a composition for forming an n-type diffusion layer.

Regarding the life time killer element in a glass powder, the content and type of the elements were analyzed with an Inductively Coupled Plasma-Optical Emission Spectrometer and an Inductively Coupled Plasma-Mass Spectrometer. The same applies for the below Examples. In the glass powder, Fe, Cu and Ni were contained as a life time killer element.

The particle shape of the glass powder was judged by observation with a scanning electron microscope (trade name: TM-1000, manufactured by Hitachi High-Technologies Corporation). The average diameter of the glass powder was calculated with a laser diffraction particle size analyzer (measurement wave length: 632 nm, trade name: LS 13 320, manufactured by Beckman Coulter, Inc.).

Next, the prepared paste (a composition for forming an n-type diffusion layer) was applied to a p-type silicon substrate surface by screen printing, and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and dried.

The surface at the side to which the composition for forming an n-type diffusion layer was applied exhibited a sheet resistance of 50Ω/□ and an n-type diffusion layer was formed through diffusion of P (phosphorus). On the other hand, the rear surface exhibited an unmeasurable sheet resistance of 1,000,000Ω/□ or higher and it was judged that no n-type diffusion layer was substantially formed. A life time of carrier was 75%.

Example 2

An n-type diffusion layer was formed in the same manner as in Example 1, except that the glass powder was changed to $SiO_2$—$P_2O_5$—CaO-based glass powder ($SiO_2$: 60 mol %, $P_2O_5$: 30 mol %, CaO: 10 mol %, life time killer element: 550 ppm, substantially spherical, average particle diameter: 3.2 μm). In the glass powder, Fe, Cu and Ni were contained as a life time killer element.

The surface at the side where the composition for forming an n-type diffusion layer was applied exhibited a sheet resistance of 46Ω/□ and the formation of an n-type diffusion layer through diffusion of P (phosphorus). The rear surface exhibited an unmeasurable sheet resistance of 1,000,000Ω/□ or higher and it was judged that no n-type diffusion layer was substantially formed. A life time of carrier was 80%.

Example 3

An n-type diffusion layer was formed in the same manner as in Example 1, except that the glass powder was changed to $SiO_2$—$P_2O_5$—CaO-based glass powder ($SiO_2$: 60 mol %, $P_2O_5$: 30 mol %, CaO: 10 mol %, life time killer element: 460 ppm, substantially spherical, average particle diameter: 3.1 μm). In the glass powder, Fe, Cu and Ni were contained as a life time killer element.

The surface at the side where the composition for forming an n-type diffusion layer was applied exhibited a sheet resistance of 51Ω/□ and the formation of an n-type diffusion layer through diffusion of P (phosphorus). The rear surface exhibited an unmeasurable sheet resistance of 1,000,000Ω/□ or higher and it was judged that no n-type diffusion layer was substantially formed. A life time of carrier was 85%.

Example 4

An n-type diffusion layer was formed in the same manner as in Example 1, except that the glass powder was changed to $SiO_2$—$P_2O_5$—CaO based glass powder ($SiO_2$: 60 mol %, $P_2O_5$: 30 mol %, CaO: 10 mol %, life time killer element: 110 ppm, substantially spherical, average particle diameter: 3.5 μm). In the glass powder, Fe, Cu and Ni were contained as a life time killer element.

The surface at the side where the composition for forming an n-type diffusion layer was applied exhibited a sheet resistance of 47Ω/□ and the formation of an n-type diffusion layer through diffusion of P (phosphorus). The rear surface exhibited an unmeasurable sheet resistance of 1,000,000Ω/□ or higher and it was judged that no n-type diffusion layer was substantially formed. A life time of carrier was 90%.

Example 5

An n-type diffusion layer was formed in the same manner as in Example 1, except that the glass powder was changed to $SiO_2$—$P_2O_5$—CaO-based glass powder ($SiO_2$: 60 mol %, $P_2O_5$: 30 mol %, CaO: 10 mol %, life time killer element: 90 ppm, substantially spherical, average particle diameter: 3.3 μm). In the glass powder, Fe, Cu and Ni were contained as a life time killer element.

The surface at the side where the composition for forming an n-type diffusion layer was applied exhibited a sheet resistance of 47Ω/□ and the formation of an n-type diffusion layer through diffusion of P (phosphorus). The rear surface exhibited an unmeasurable sheet resistance of 1,000,000Ω/□ or higher and it was judged that no n-type diffusion layer was substantially formed. A life time of carrier was 92%.

Example 6

An n-type diffusion layer was formed in the same manner as in Example 1, except that the glass powder was changed to SiO$_2$—P$_2$O$_5$—CaO-based glass powder (SiO$_2$: 60 mol %, P$_2$O$_5$: 30 mol %, CaO: 10 mol %, life time killer element: 20 ppm, substantially spherical, average particle diameter: 3.1 μm). In the glass powder, Fe, Cu and Ni were contained as a life time killer element.

The surface at the side where the composition for forming an n-type diffusion layer was applied exhibited a sheet resistance of 50Ω/☐ and the formation of an n-type diffusion layer through diffusion of P (phosphorus). The rear surface exhibited an unmeasurable sheet resistance of 1,000,000Ω/☐ or higher and it was judged that no n-type diffusion layer was substantially formed. A life time of carrier was 97%.

Example 7

An n-type diffusion layer was formed in the same manner as in Example 1, except that the glass powder was changed to SiO$_2$—P$_2$O$_5$—CaO-based glass powder (SiO$_2$: 60 mol %, P$_2$O$_5$: 30 mol %, CaO: 10 mol %, life time killer element: 8 ppm, substantially spherical, average particle diameter: 3.2 μm). In the glass powder, Fe, Cu and Ni were contained as a life time killer element.

The surface at the side where the composition for forming an n-type diffusion layer was applied exhibited a sheet resistance of 50Ω/☐ and the formation of an n-type diffusion layer through diffusion of P (phosphorus). The rear surface exhibited an unmeasurable sheet resistance of 1,000,000Ω/☐ or higher and it was judged that no n-type diffusion layer was substantially formed. A life time of carrier was 100%.

Comparative Example 1

20 g of ammonium dihydrogen phosphate (NH$_4$H$_2$PO$_4$) powder, 3 g of ethylcellulose, and 7 g of 2-(2-butoxyethoxy) ethyl acetate were mixed and made into a paste to prepare a composition for forming an n-type diffusion layer.

Next, the prepared paste was applied to a p-type silicon substrate surface by screen printing, and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and drying.

The surface at the side where the composition for forming an n-type diffusion layer was applied exhibited a sheet resistance of 14Ω/☐ and the formation of an n-type diffusion layer through diffusion of P (phosphorus). The rear surface, however, exhibited a sheet resistance of 50Ω/☐ and also exhibited the formation of an n-type diffusion layer.

Comparative Example 2

1 g of ammonium dihydrogen phosphate (NH$_4$H$_2$PO$_4$) powder, 7 g of pure water, 0.7 g of polyvinyl alcohol, and 1.5 g of isopropyl alcohol were mixed to form a solution, thereby preparing a composition for forming an n-type diffusion layer.

Next, the prepared solution was applied to a p-type silicon substrate surface by a spin coater (2000 rpm, 30 sec), and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and drying.

The surface at the side where the composition for forming an n-type diffusion layer was applied exhibited a sheet resistance of 10Ω/☐ and the formation of an n-type diffusion layer through diffusion of P (phosphorus). The rear surface, however, exhibited a sheet resistance of 100Ω/☐ and also exhibited the formation of an n-type diffusion layer.

Comparative Example 3

10 g of SiO$_2$—P$_2$O$_5$—CaO-based glass powder whose particle shape is substantially spherical, average particle diameter is 3.5 μm (SiO$_2$: 60 mol %, P$_2$O$_5$: 30 mol %, CaO: 10 mol %, life time killer element: 1150 ppm), 4 g of ethylcellulose and 86 g of 2-(2-butoxyethoxy) ethyl acetate were mixed with an automatic mortar kneading machine and made into a paste to prepare a composition for forming an n-type diffusion layer. In the glass powder, Fe, Cu and Ni were contained as a life time killer element.

Next, the prepared paste (a composition for forming an p-type diffusion layer) was applied to a p-type silicon substrate surface by screen printing, and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and dried.

The surface at the side to which the composition for forming an n-type diffusion layer was applied exhibited a sheet resistance of 48Ω/☐ and an n-type diffusion layer was formed through diffusion of P (phosphorus). On the other hand, the rear surface exhibited an unmeasurable sheet resistance of 1,000,000Ω/☐ or higher and it was judged that no n-type diffusion layer was substantially formed. A life time of carrier was 67%, which was lower.

EXPLANATIONS OF LETTERS OR NUMERALS

10: p-type semiconductor substrate
12: n-type diffusion layer
14: high-density electric field layer
16: antireflective film
18: front surface electrode
20: rear surface electrode (electrode layer)
30: bus bar electrode
32: finger electrode

The invention claimed is:

1. A method of forming an n-type diffusion layer, the method comprising: providing a composition for forming an n-type diffusion layer, the composition comprising a glass powder and a dispersion medium, wherein the glass powder includes a donor element and a total amount of a life time killer element in the glass powder is 1000 ppm or less, and wherein the glass powder has an average particle diameter of 3.5 μm or less; applying the composition for forming an n-type diffusion layer to a semiconductor substrate; and conducting a thermal diffusion treatment to diffuse the donor element into the semiconductor substrate.

2. The method of claim 1, wherein the donor element is at least one selected from phosphorous (P) or antimony (Sb).

3. The method of claim 1, wherein the glass powder comprises at least one donor element-containing material selected from P$_2$O$_3$, P$_2$O$_5$ or Sb$_2$O$_3$, and at least one glass component material selected from SiO$_2$, K$_2$O, Na$_2$O, Li$_2$O, BaO, SrO, CaO, MgO, BeO, ZnO, PbO, CdO, SnO, ZrO$_2$ or MoO$_3$.

4. The method of claim 1, wherein the composition for forming an n-type diffusion layer further comprises a metal element that is crystallized upon reacting with the glass powder.

5. The method of claim 4, wherein the metal element that is crystallized upon reacting with the glass powder is at least one selected from silver (Ag), silicon (Si) or zinc (Zn).

6. The method of claim 1, wherein the life time killer element is at least one selected from iron (Fe), copper (Cu), nickel (Ni), manganese (Mn), chromium (Cr), tungsten (W) or gold (Au).

7. A method of producing a photovoltaic cell, the method comprising: providing a composition for forming an n-type diffusion layer, the composition comprising a glass powder and a dispersion medium, wherein the glass powder includes a donor element and a total amount of a life time killer element in the glass powder is 1000 ppm or less, and wherein the glass powder has an average particle diameter of 3.5 μm or less; applying the composition for forming an n-type diffusion layer to a semiconductor substrate; and conducting a thermal diffusion treatment to form an n-type diffusion layer in the semiconductor substrate by diffusion of the donor element; and forming an electrode on the n-type diffusion layer.

8. The method of claim 7, wherein the donor element is at least one selected from phosphorous (P) or antimony (Sb).

9. The method of claim 7, wherein the glass powder comprises at least one donor element-containing material selected from $P_2O_3$, $P_2O_5$ or $Sb_2O_3$, and at least one glass component material selected from $SiO_2$, $K_2O$, $Na_2O$, $Li_2O$, BaO, SrO, CaO, MgO, BeO, ZnO, PbO, CdO, SnO, $ZrO_2$ or $MoO_3$.

10. The method of claim 7, wherein the composition for forming an n-type diffusion layer further comprises a metal element that is crystallized upon reacting with the glass powder.

11. The method of claim 10, wherein the metal element that is crystallized upon reacting with the glass powder is at least one selected from silver (Ag), silicon (Si) or zinc (Zn).

12. The method of claim 7, wherein the life time killer element is at least one selected from iron (Fe), copper (Cu), nickel (Ni), manganese (Mn), chromium (Cr), tungsten (W) or gold (Au).

* * * * *